United States Patent [19]

Yau et al.

[11] Patent Number: 4,755,480
[45] Date of Patent: Jul. 5, 1988

[54] METHOD OF MAKING A SILICON NITRIDE RESISTOR USING PLASMA ENHANCED CHEMICAL VAPOR DEPOSITION

[75] Inventors: Leopoldo D. Yau, Portland, Oreg.; Shih-ou Chen, Fremont, Calif.; Yih S. Lin, Beaverton, Oreg.

[73] Assignee: Intel Corporation, Santa Clara, Calif.

[21] Appl. No.: 930,148

[22] Filed: Nov. 12, 1986

Related U.S. Application Data

[63] Continuation-in-part of Ser. No. 825,314, Feb. 3, 1986, abandoned.

[51] Int. Cl.$^4$ .......................... H01C 7/10; H01L 29/04
[52] U.S. Cl. .......................................... 437/47; 437/60; 437/193; 437/200; 437/190; 437/241; 437/918; 148/DIG. 114; 148/DIG. 136; 357/51
[58] Field of Search ............ 29/576 C, 576 B, 577 C, 29/578, 591; 148/1.5, 174, 187, DIG. 83, 104, 118, 136, 147; 357/51; 427/101, 88, 93, 94

[56] References Cited

U.S. PATENT DOCUMENTS

| | | | |
|---|---|---|---|
| 4,291,328 | 9/1981 | Lien et al. | 357/59 |
| 4,403,394 | 9/1983 | Shepard et al. | 29/571 |
| 4,406,051 | 9/1983 | Iizuka | 29/576 B |
| 4,420,766 | 12/1983 | Kaston | 357/59 |
| 4,477,310 | 10/1984 | Park et al. | 29/571 |
| 4,547,959 | 10/1985 | Rusch | 29/577 C |
| 4,569,122 | 2/1986 | Chan | 29/577 C |
| 4,609,903 | 9/1986 | Toyokura et al. | 357/51 |
| 4,609,935 | 9/1986 | Kondo | 357/51 |

FOREIGN PATENT DOCUMENTS

| | | |
|---|---|---|
| 0122659 | 10/1984 | European Pat. Off. . |
| 0165538 | 12/1985 | European Pat. Off. . |
| 0850770 | 3/1983 | Japan ............................ 29/576 C |
| 1488728 | 10/1977 | United Kingdom . |

OTHER PUBLICATIONS

Ghandhi, "VLSI Fabrication Principles", John Wiley & Sons, New York, NY, 4/5/1984, pp. 427–429 & 435–437.
Adams, "VLSI Technology" edited by Sze, McGraw-Hill, 1983, pp. 120–123.

*Primary Examiner*—Brian E. Hearn
*Assistant Examiner*—William Bunch
*Attorney, Agent, or Firm*—Blakely, Sokoloff, Taylor & Zafman

[57] ABSTRACT

An improved resistor for use in MOS integrated circuits. An opening is formed in an insulative layer which separates two conductive regions. A plasma enhanced chemical vapor deposition of passivation material such as silicon-rich silcon nitride is deposited in the window, contacting both conductive regions and providing resistance in a vertical direction between these regions.

A subsequent annealing process involving controlled temperatures and cycle times provides for determining desired resistive values from an equivalent deposition process. Further, a barrier metal layer may be formed between the vertical resistor and the second conductive region.

3 Claims, 8 Drawing Sheets

METHOD OF MAKING A SILICON NITRIDE RESISTOR USING PLASMA ENHANCED CHEMICAL VAPOR DEPOSITION

This is a continuation in part of application Ser. No. 825,314, filed Feb. 3, 1986, now abandoned.

BACKGROUND OF THE INVENTION

1. Field of the Invention

The invention relates to the field of MOS integrated circuits, and particularly to the formation of resistor elements in such circuits.

2. Prior Art

In the early years of metal-oxide-semiconductor (MOS) technology, resistance elements for integrated circuits were provided by diffused regions in the substrate, polysilicon members, and the like. These elements, which occupied relatively large areas in the circuit, are not as widely used with the advent of more complex circuitry requiring higher densities.

The lack of adequate resistors for use in high-density semiconductor integrated circuits led to an avoidance of their use. Circuits were deliberately designed to use fewer resistors, and transistors were, in many cases, used as load devices in place of resistors. The static memory cell, for instance, has traditionally been constructed as a six-transistor bistable circuit, in which two of the six transistors serve as load devices.

Resistor elements utilizing ion-implanted regions have been described in U.S. Pat. No. 4,246,692 (implanted regions buried field oxide), U.S. Pat. No. 4,110,776 (implanted resistor over field oxide), U.S. Pat. No. 4,290,716 (implanted resistors in second-level polysilicon) and U.S. Pat. No. 4,330,931 (polysilicon and tungsten composite members). The closest prior art examples known to Applicant are the vertically-oriented buried polysilicon resistor element described by Yoshio Sakai et al, 1984 Symposium on VSLI Technology Digest of Technical Papers, p. 6–7, Sept. 1984, and the ion-implanted polysilicon resistor element described in U.S. Pat. No. 4,416,049 and the plasma enchanced chemical vapor desposition described by A. C. Adams, *VSLI Technology*, pp. 93–129, edited by S. M. Sze, McGraw-Hill, 1983.

Each of these prior art techniques presents associated difficulties. The conductivity of polysilicon creates a need for relatively large polysilicon resistor elements, since a relatively long pathway is required to achieve the desired resistance. Many of the prior art techniques require critical masking steps to achieve the necessary precision in the length and width of the polysilicon load. Use of polysilicon loads can also give a high surface contour, leading to fracturing of the films on the final circuit. The high diffusivity for boron or phosphorus dopants in polysilicon lends additional difficulties to the use of high-resistive polysilicon regions as load devices.

The present invention represents a departure from previous technologies. This invention uses a plasma enhanced vapor deposition silicon-rich nitride film as a contact-window-load device. This film is not polysilicon, although it could have micro-polysilicon intermixed with nitride, and presents a number of advantages over polysilicon for use as a resistor element.

SUMMARY OF THE INVENTION

An improved resistor element is described for use in MOS integrated circuits. This resistor element serves as a contact-window-load device between two conductive regions separated by an insulative layer. An opening is formed in the insulative layer, and a plasma enchanced chemical vapor deposition (PECVD) silicon (Si)-rich nitride is deposited and patterned to leave the Si-rich nitride over the contact window. This Si-rich nitride film contacts both conductive regions (above and below the insulative layer) and provides resistance in a vertical direction between these regions.

The plasma process allows for deposition of the Si-rich film at low temperatures and provides for resistive load in a semiconductor device. Although the preferred embodiment illustrates the use of the resistive material in a memory cell, it will be obvious to one skilled in the art that this technique may be utilized in other integrated circuits.

A subsequent annealing process involving controlled temperatures and cycle times provides for determining desired resistive values from an equivalent deposition process.

After the formation of the resistive load, subsequent metallization processes permit the formation of a second conductive layer. In one embodiment, a barrier metal layer is formed between the vertical resistor and the second conductive layer to provide a barrier and also act as an anti-reflective coating.

DETAILED DESCRIPTION OF THE PRESENT INVENTION

A process for fabricating a contact-window resistor element in an MOS integrated circuit is described. While the currently preferred embodiment of the present invention involves placement of the contact-window resistor over a metal-plated polysilicon region of a field-effect transistor device, it will be obvious to one skilled in the art that the invention may readily be adpated for use in other embodiments. In the following description, numerous specific details are set forth to provide a thorough understanding or the present invention. Again, it will be obvious to one skilled in the art that the invention may be employed without these specific details. In other instances, well-known processing steps have not been described in detail in order not to unnecessarily obscure the present invention.

Figure 1:
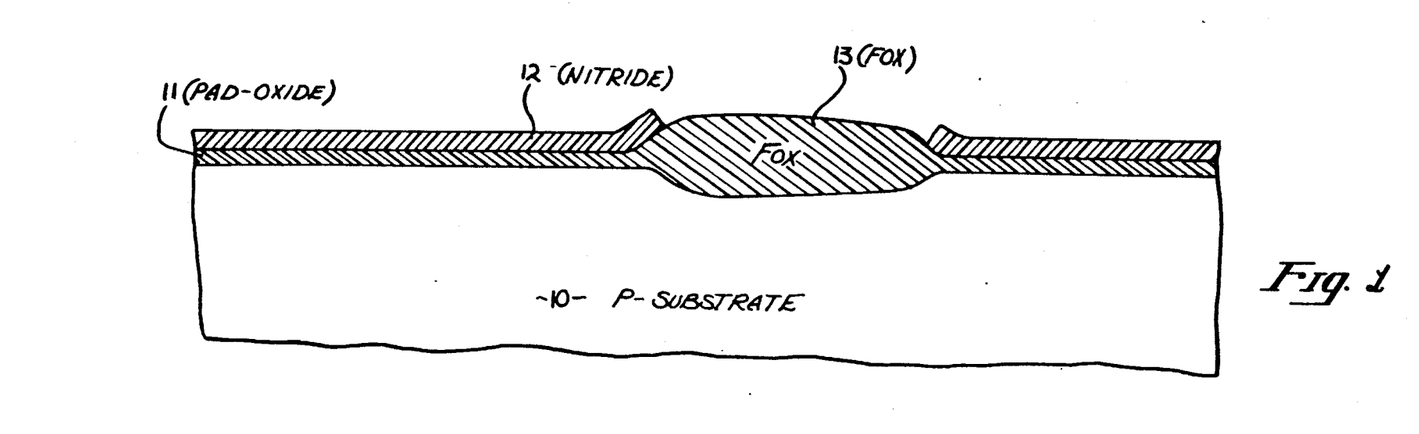
FIG. 1 is a cross-sectional elevation view of a portion of silicon substrate which includes a field oxide region, a pad-oxide layer and a nitride layer.

Referring to FIG. 1, a p-type monocrystalline silicon substrate 10 is illustrated. Following the growth of a relatively thin pad-oxide layer 11 of 500 to 1000A on the surface of the substate 10, a nitride layer 12 of 700 to 1200A is formed over the pad-oxide layer 11. By lithography a nitride layer 12 is removed over the areas where thick field oxide is desired. Then a field-oxide (FOX) region 13 is thermally grown in areas without the nitride layer 12 to a thickness of 5000 to 10,000A.

Figure 2:
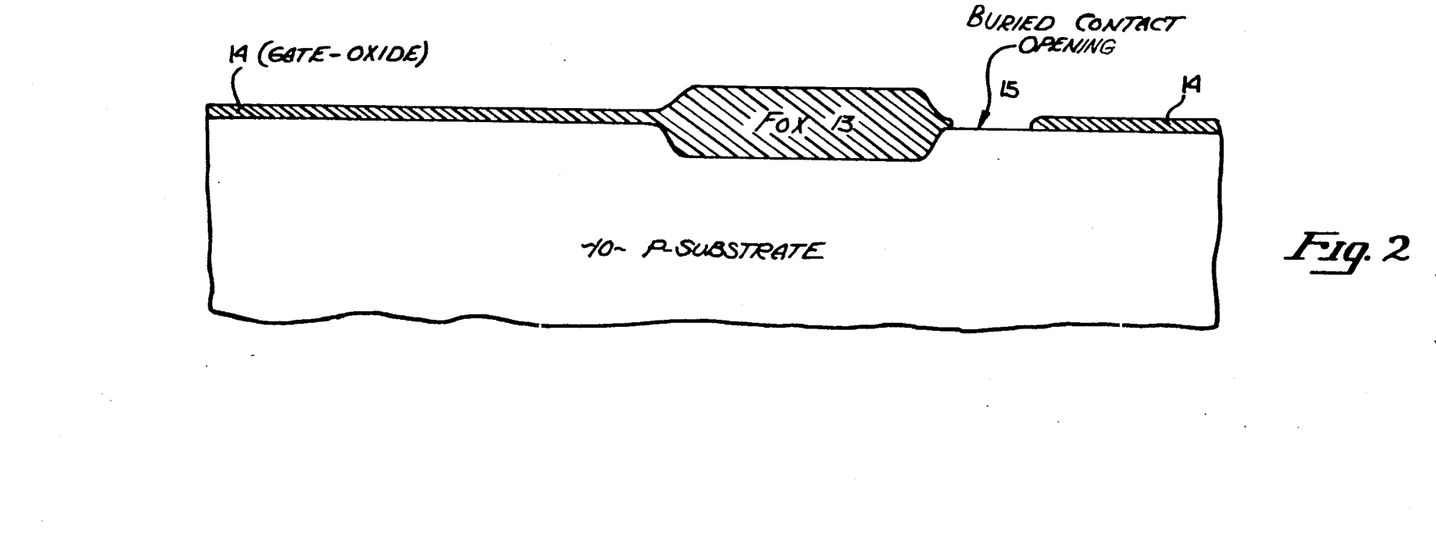
FIG. 2 illustrates deposition of a gate oxide layer and a buried contact opening in the gate-oxide layer.

Referring to FIG. 2, the nitride layer 12 and pad-oxide layer 11 are removed by conventional etching methods. A gate-oxide layer 14 of 200 to 250A is grown. Where a buried contact is desired, an opening 15 is made by conventional lithographic process.

Figure 3:
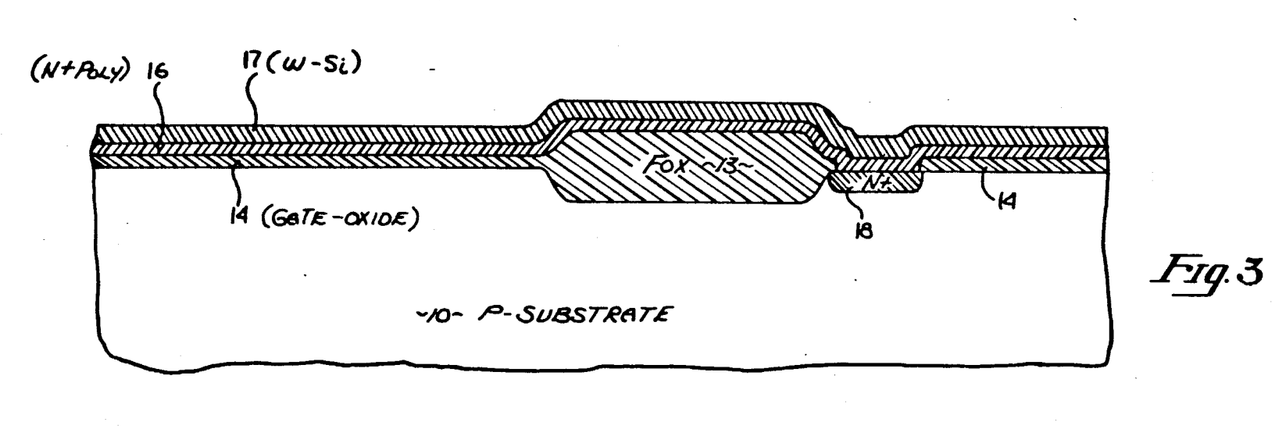
FIG. 3 illustrates deposition of a polysilicon and a tungsten-silicon layer as well as deposition of a n+ region of the buried contact.

Referring to FIG. 3, a polysilicon layer 16 of 1000 to 3000A is deposited on the gate-oxide layer 14. For low resistance gate application, a tungsten-silicon (W-Si) layer 17 of 2000 to 3000A is deposited on the polysilicon layer 16. The polysilicon layer 16 is doped by phosphorus diffusion. The doping of polysilicon layer 16 to form an n+ layer may be accomplished either prior to or after the the deposition of W-Si layer 17. The doping process also forms an n+ buried contact 18 at opening 15.

Figure 4:
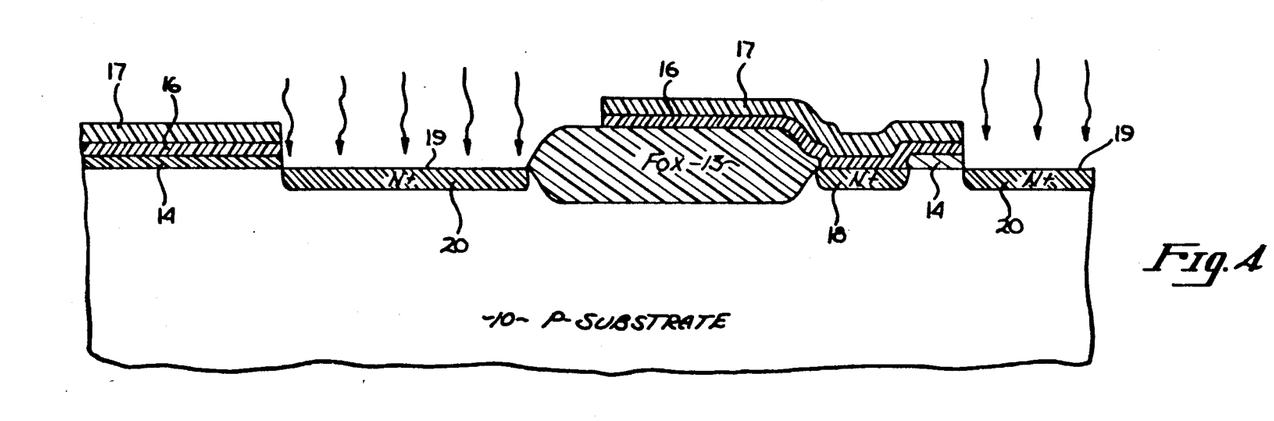
FIG. 4 illustrates the etching and deposition of source/drain regions.

In FIG. 4, W-Si layer 17, polysilicon layer 16 and gate-oxide layer 14 are patterned and etched to provide openings 19. This process is then followed by a self-aligned implant to form n+ regions 20.

Figure 5:
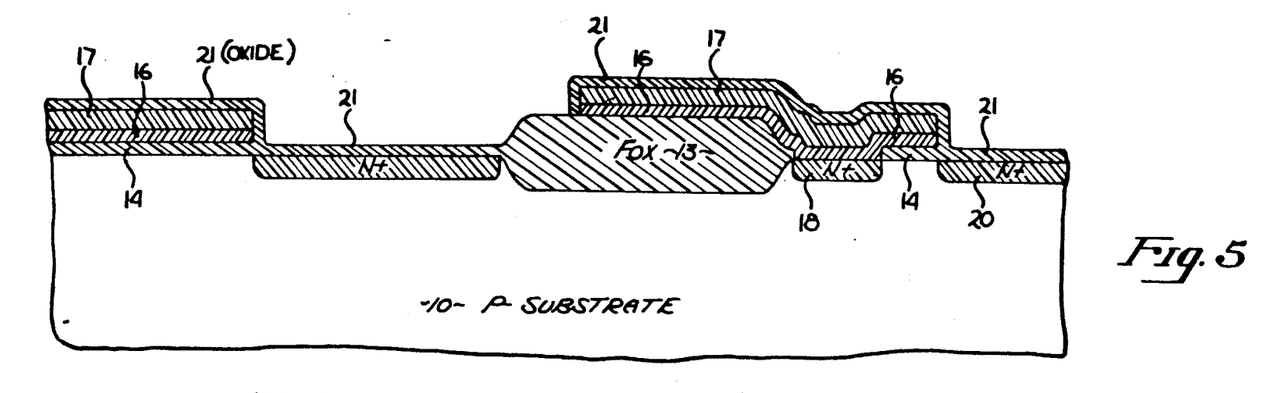
FIG. 5 illustrates the growth of an oxide layer.

After the formation of regions 10, a high-temperature re-oxidation process will grow an oxide layer 21 anywhere where silicon or tungsten-silicon is exposed as shown in FIG. 5, wherein W-Si layer 17 is covered by oxide layer 21. The oxide layer 21 also grows over the opening 19 wherein the implant regions 20 are also annealed during the growth process of the oxide layer 21.

Figure 6:
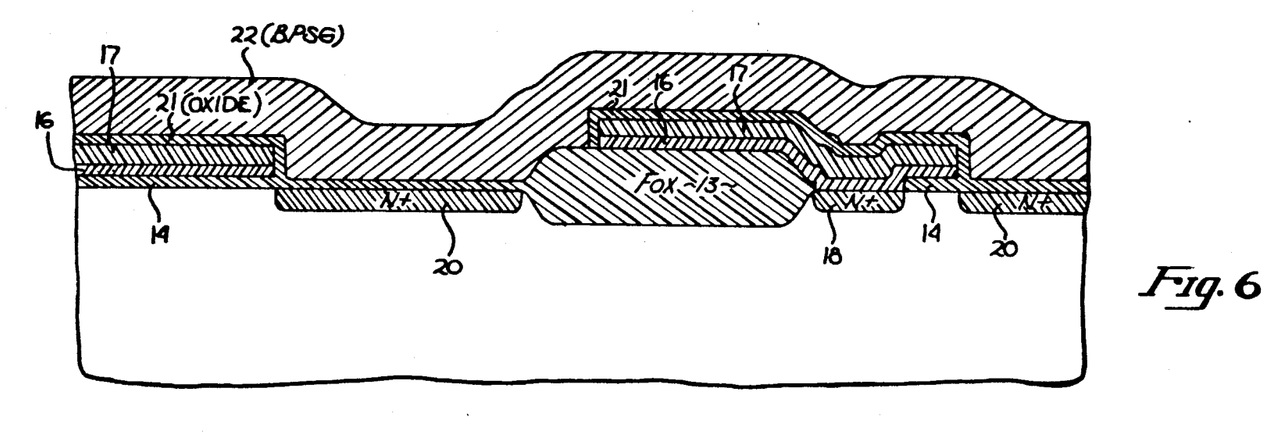
FIG. 6 illustrates the deposition of a glass film layer.
Figure 7:
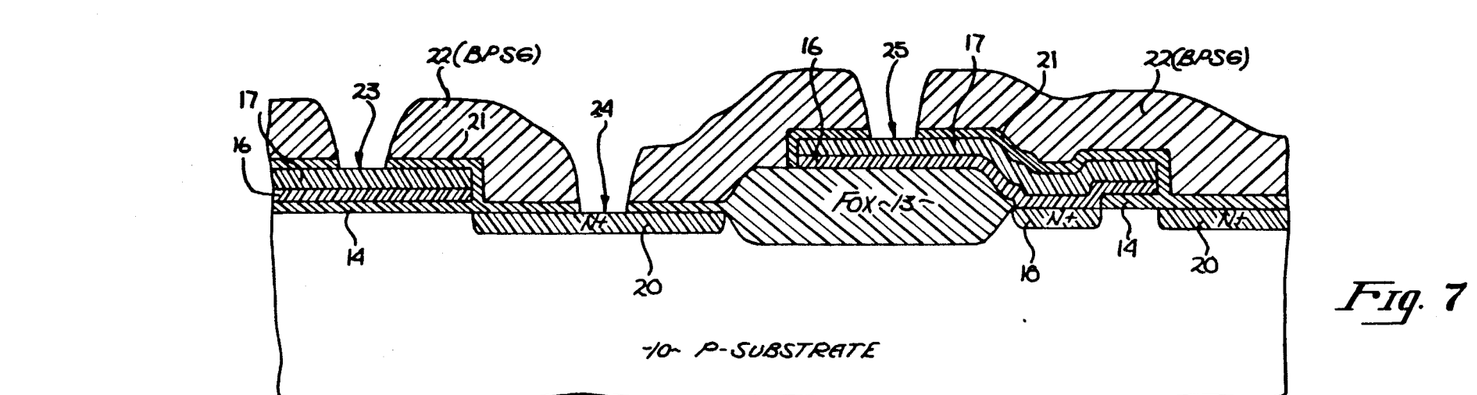
FIG. 7 illustrates the opening of windows for placing electrical contacts.

Referring to FIG. 6, either a boro-phosphosilicate glass (BPSG) or phosphosilicate glass (PSG) film layer 22 is deposited over the complete surface and reflowed to smooth the topology. Then, contact windows 23, 24 and 25 are opened in in layers 21 and 22 by lithography and etching methods as shown in FIG. 7.

Figure 8:
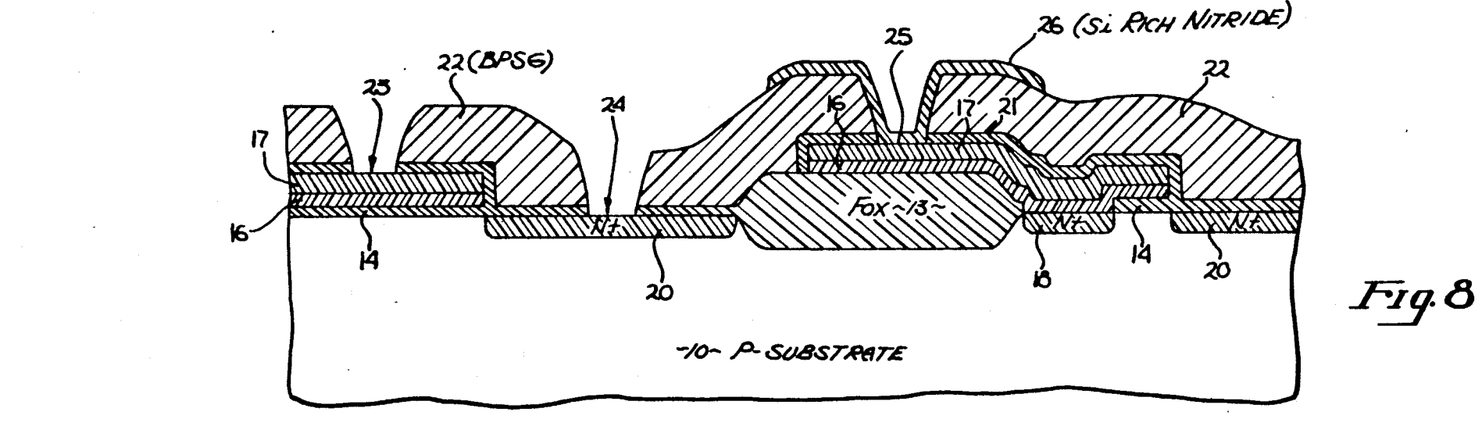
FIG. 8 illustrates the deposition of silicon-richnitride for forming the vertical resistor.

FIG. 8 illustrates the application of the actual resistor material to the substrate. While potentially any insulative material doped with silicon may be used for this purpose, the currently preferred embodiment uses silicon-rich silicon nitride obtained through plasma enhanced chemical vapor deposition (PECVD). A Si-rich nitride film layer 26 is deposited and patterned over window 25 by PECVD method. The PECVD process is accomplished with a mixture of silane, nitrogen, and ammonia at a total pressure of, for example, 0.5–1.5T, and at a temperature of, for example, 308–550 degree C. The partial pressure of silane may be, for example, 0.3–0.8T. The amount of ammonia to be used in the process is relatively small, and is varied to control the ratio of silicon nitride to silicon dopant deposited: a relatively lower ammonia concentration in the PECVD mixture gives a relatively higher silicon dopant concentration in the resistor material deposited on the substrate.

The grain size of the material to which the resistor element 26 is applied determines the thickness of the layer desired, and a thicker semi-insulative layer requires more silicon dopant to afford the same resistivity. Tungsten-silicide, having a relatively large grain size, requires a relatively thick semi-insulative layer. In this case, the semi-insulative layer may be, for example, 1000–2000A thick. In areas where the Si-rich nitride film is not desired, removal is accomplished by conventional wet etching or plasma etching methods. Alternatively Si-rich nitride film may be deposited by low-temperature e-gun evaporation method and the lift-off masking method employed.

Another method to control the resistivity of the vertical load resistor is achieved by controlling the annealing cycle. After deposition of Si-rich nitride film layer 26 at deposition temperatures of approximately 500 degrees C., a subsequent anneal above 600 degrees C. will effectively reduce and stabilize the resistivity of the film layer 26. By varying annealing temperatures and cycle times, different resistivities are achieved from equivalent film depositions. This property permits a single Si-rich nitride layer 26 deposition process to have varying resistive values, whereas without this annealing step, layer 26 deposition parameters may have to be varied for differently desired resistive values.

Further, the controlling of resistive values by the annealing process permits reduced Si content of the film layer 26, which results in the advantages of easier deposition and etching. Because this subsequent annealing step is the last high-temperature anneal, the resistivity determined during this annealing step will not change due to another high-temperature process.

Figure 9:
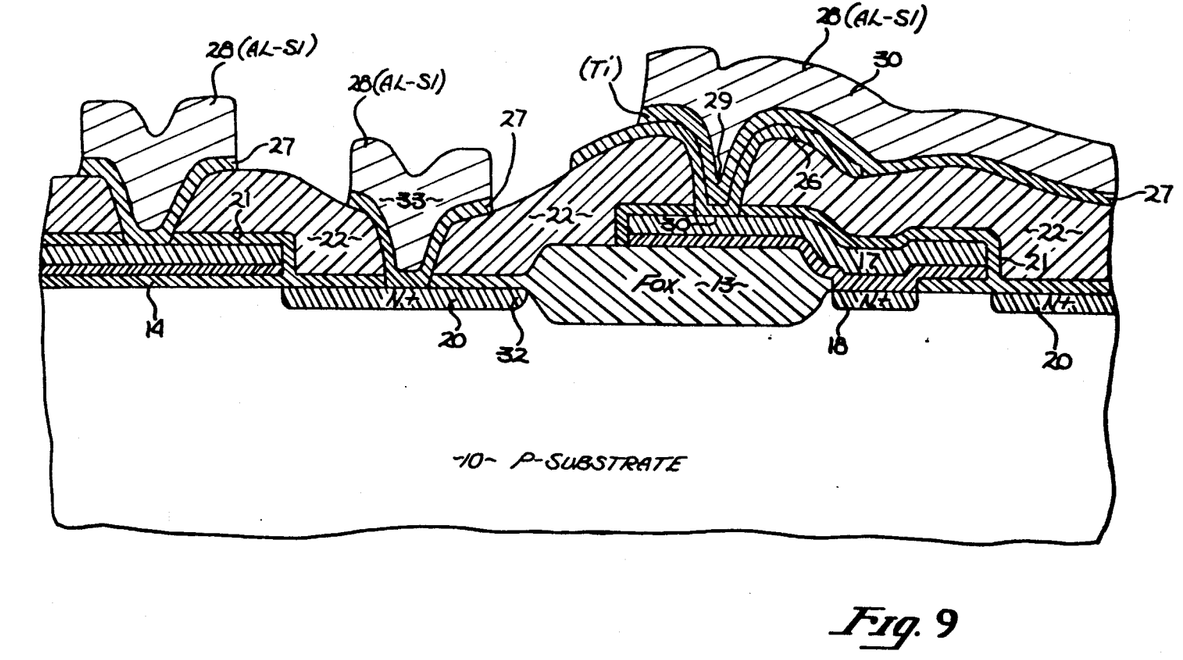
FIG. 9 illustrates the metallization step of laying the electrical contacts.

Referring to FIGS. 8 and 9, a titanium layer 27 is deposited over windows 23 and 24, as well as over the Si-rich nitride layer 26 over window 25. The Ti layer 27 thickness is of 500 to 1000A. The Ti layer 27 is known to prevent aluminum from shorting the underlying silicon or Si-rich nitride film. Other well-known barrier metals such as Ti-tungsten can be used as well. An aluminum-silicon region 28 formed above the Ti layers 27 provides the electrical contact. Thus, the Al-Si region 29 is in electrical contact with a contact-window resistor layer 26. Resistance is provided by the film of Si-rich nitride film layer 26 located vertically between electrical contact 30 and a conductive region 29. A source region 32 makes simple electrical contact with metal member 33, where no resistor is present. Although a vertical contact load resistor is shown located over the FOX region 13, it could also be located above the contacts defined directly over the n+ diffusion regions 20, or the silicide buried region above diffusion region 18. Metal layer 28 is normally called metal 1 and whenever it is advantageous to add a second level metal, the vertical load resistor is also applicable.

Figure 10:
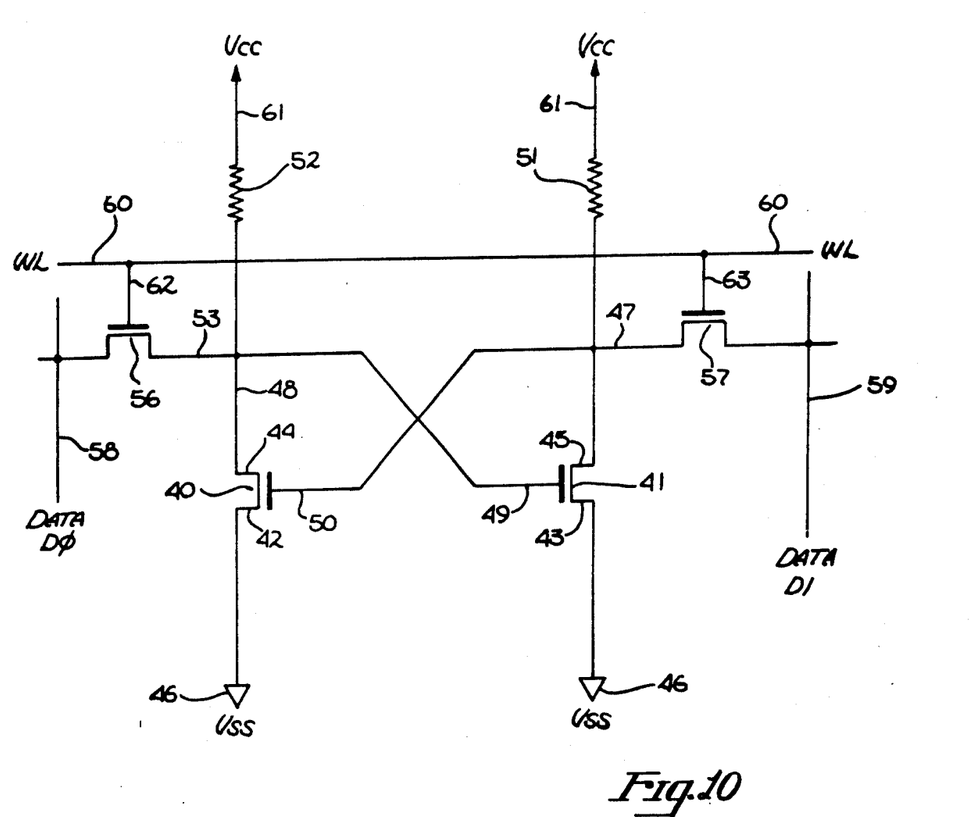
FIG. 10 is an electrical schematic diagram of a memory cell.
Figure 11:
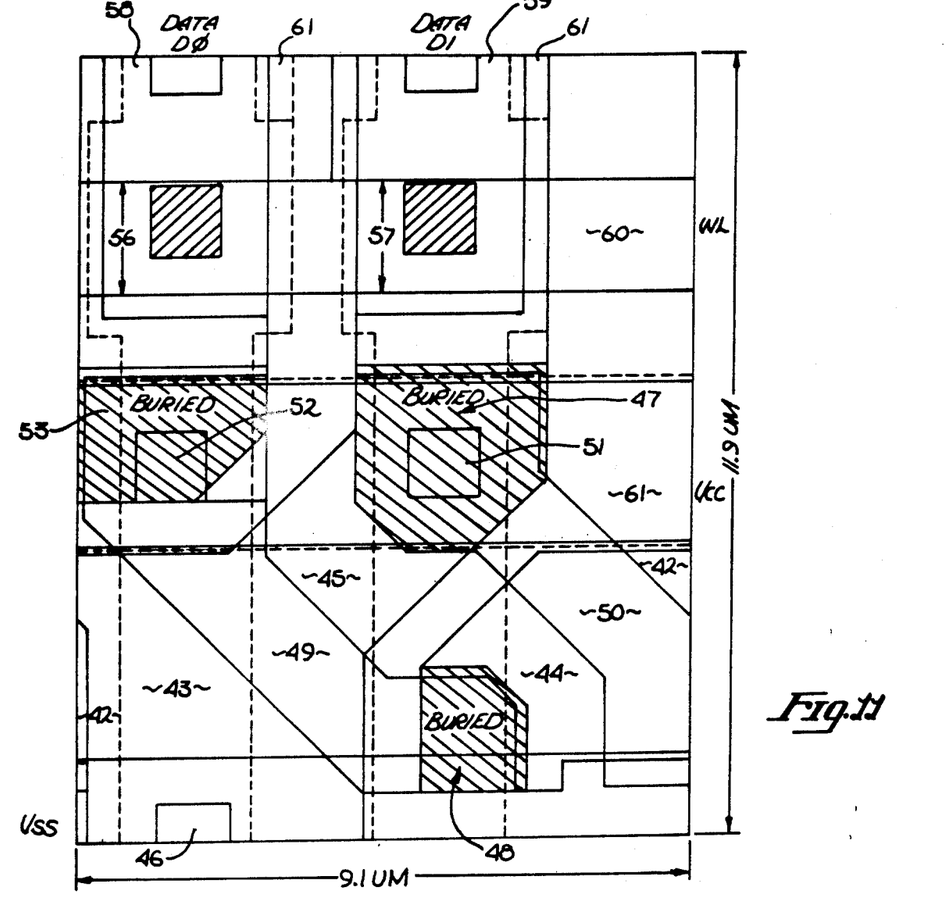
FIG. 11 is a layout of the memory cell depicted in FIG. 10.

Referring now to FIGS. 10 and 11, a bistable static random access memory cell utilizing the teachings of the present invention is illustrated. FIG. 10 is a schematic diagram and FIG. 11 is a semiconductor chip layout of the schematic FIG. 10. The labels used in FIG. 10 correspond to the same levels in FIG. 11. The circuit consists of a pair of cross-coupled transistors 40 and 41, each having its source 42 and 43 connected to ground 46 ($V_{ss}$). The drain 44 of transistor 40 is coupled via a buried contact 48 to the gate 49 of transistor 41, while the drain 45 of transistor 41 is connected at a buried contact 47 to the gate 50 of transistor 40, providing the cross-coupled connection of a bistable circuit. The gate 49 of transistor 41 and the drain 44 of transistor 40 are further connected through a resistor 52 to a first-level metal strip 61 which is $V_{cc}$. The resistor 52 is a contact-window resistor fabricated in accordance with the teachings of the present invention. Similarly, the drain 45 of transistor 41 and the gate 50 of transistor 40 are connected through a contact-window resistor 51 to the Vcc by strip 61. Second-level metal strips which are data lines 58 and 49 are connected to a pair of select transistors 56 and 57, respectively. Transistors 56 and 57 share a common W-Si gate strip which is the word address line (WL) 60. WL 60 is coupled to gates 62 and 63 of transistors 56 and 57. Transistor 56 is coupled to the gate 49 at a buried contact 53 of transistor 41 which is in turn coupled to the drain 44 of transistor 40. Transistor 57 is coupled to the drain 45 of transistor 41. Data line 58 is coupled to transistor 56 and data line 59 is coupled to transistor 57.

The present invention offers a number of advantages when compared with prior art technologies. The invention, in general, utilizes fewer masking steps for fabrication than were required by earlier techniques. In addition, the final circuit exhibits a much lower surface contour, resulting in fewer problems with fracturing of overlying metal or oxide coating. Because the resistivity is not dependent on the precise length and width of a polysilicon load device, the present process requires no critical masking steps. Further, plasma techniques allow for low-temperature deposition. Although the present invention is described in a particular embodiment, the present invention is highly versatile and can readily be used to provide resistance between two polysilicon members, two metal members, a polysilicon and a metal member, a polysilicon member and the substrate, a metal member and the substrate, etc. The high capacitance of the resistor element makes the present invention less susceptible than prior art technologies to soft errors induced by stray alpha particles.

Figure 12:
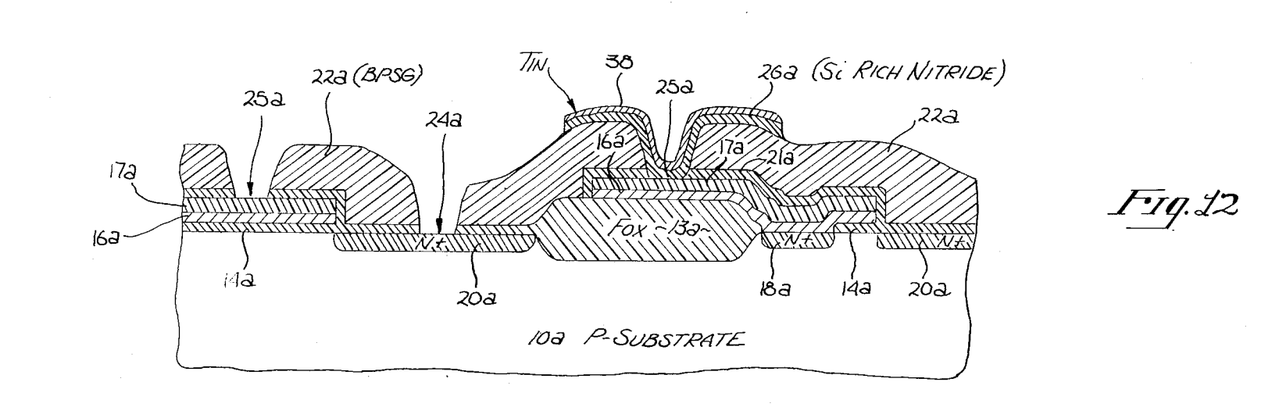
FIG. 12 is a cross-sectional elevation view of an alternate embodiment using a titanium nitride layer over the vertical resistor layer.
Figure 13:
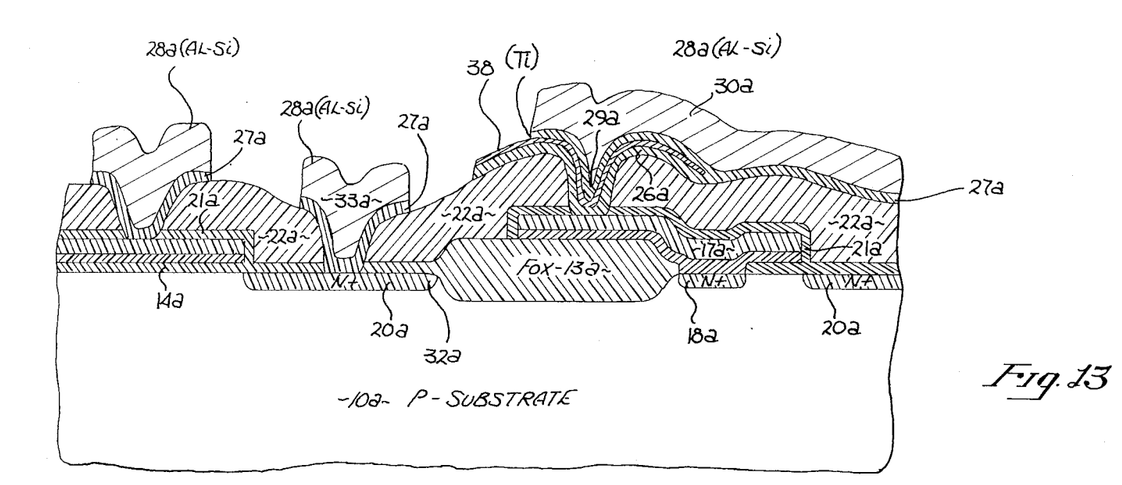
FIG. 13 illustrates the deposition of subsequent metallization layers to the alternate embodiment of FIG. 12.

Referring to FIGS. 12 and 13, an alternate embodiment of the present invention is shown. All of the layers and regions, except for a titanium nitride layer 38, is formed equivalent to the earlier descriptions in regard to FIGS. 1–9. In order to refrain from complicating the description, equivalent reference numerals have been used to designate those equivalent layers between the original and alternative embodiments; however, a letter "a" has been added to the numerals of FIGS. 12 and 13 to reflect the altenrate embodiment. Therefore, the processing steps prior to the deposition of TiN layer 38 is equivalent to that of the original embodiment.

After the deposition of Si-rich nitride film layer 26a, the TiN layer 38 is deposited and patterned over the vertical load film 26a Then, Al-Si layer 28a is deposited directly on layer 38, or alternatively, Ti layer 27a is deposited and patterned prior to deposition of Al-Si layer 28a. Titanium nitride is a barrier metal and operates to form a barrier metal layer above the film layer 26a.

The barrier properties of TiN layer 38 functions to prevent aluminum metal spiking into the vertical load film 26a. It has been found that a TiN layer 38 of 900 angstroms functions as a good barrier when temperature cycles of 400 degrees C. are used after the the formation of Al-Si layer 28a. Another advantage of using TiN layer 38 is the property of titanium nitride to operate as an anti-reflective coating during subsequent patterning steps.

Thus, an improved resistor element has been described for use in MOS integrated circuits. Between two conductive regions separated by an insulative layer, resistance is provided by a thin Si-rich nitride film deposited in a contact window opened in the insulative layer.

We claim:

1. A process for fabricating a silicon-rich silicon nitride integrated circuit resistor comprising the steps of:
   growing a gate-oxide layer on a substrate;
   removing a portion of said gate-oxide layer to expose said substrate;
   forming a polysilicon layer on said gate-oxide and said portion of exposed substrate;
   doping said polysilicon layer by phosphorus diffusion wherein a buried contact region is formed in said portion of exposed substrate;
   forming a layer of tungsten-silicon on said polysilicon layer;
   growing an oxide layer on said tungsten-silicon layer;
   forming an insulative layer on said oxide layer;
   opening a window in said insulative layer and said oxide, wherein said opening extends to said tungsten-silicon layer;
   forming a film of silicon-rich silicon nitride in said window, said silicon-rich silicon nitride film being deposited in said window using a plasma enhanced chemical vapor deposition technique at approximately 500 degrees C., said silicon-rich silicon nitride film contacting said tungstensilicon layer;
   annealing said silicon-rich silicon nitride film at temperatures above 600 degrees C. wherein said annealing temperature and cycle times determine resistivity of said film;
   forming a barrier layer comprised of titanium nitride on said annealed silicon-rich silicon nitride film;
   forming a second conductive layer on said barrier layer, said second conductive layer having a titanium layer and an aluminum-silicon layer;
   whereby a resistor element is fabricated between two conductors in an integrated circuit.

2. The process defined by claim 1, wherein said insulating layer is comprised of a material selected from the group consisting of phosphorus glass and boro-phosphosilicate glass.

3. The process defined by claim 2, wherein said silicon-rich silicon nitride is formed by a mixture of silane, nitrogen, and ammonia at an approximate pressure of 0.5–1.5T and at a temperature of approximately 308°–505° C.

* * * * *